United States Patent [19]

Kreuz et al.

[11] Patent Number: 5,166,308
[45] Date of Patent: Nov. 24, 1992

[54] COPOLYIMIDE FILM WITH IMPROVED PROPERTIES

[75] Inventors: John A. Kreuz, Columbia; Richard F. Sutton, Jr., Circleville, both of Ohio

[73] Assignee: E. I. Du Pont de Nemours and Company, Wilmington, Del.

[21] Appl. No.: 516,887

[22] Filed: Apr. 30, 1990

[51] Int. Cl.⁵ ............... C08G 69/26; C08G 14/00; C08G 63/00

[52] U.S. Cl. ................... 528/188; 528/125; 528/126; 528/128; 528/170; 528/172; 528/173; 528/176; 528/183; 528/220; 528/229; 528/350; 528/351; 528/353

[58] Field of Search ........... 528/125, 126, 128, 170, 528/172, 176, 173, 183, 188, 220, 229, 350, 351, 353; 428/473.5

[56] References Cited

U.S. PATENT DOCUMENTS

| | | | |
|---|---|---|---|
| 4,239,880 | 12/1980 | Darms | 528/185 |
| 4,680,195 | 7/1987 | Pfeifer | 528/26 |
| 4,778,872 | 10/1988 | Sasaki et al. | 528/176 |
| 4,783,372 | 11/1988 | Pfeifer | 528/26 |
| 5,003,030 | 3/1991 | Hayashi et al. | 528/170 |

OTHER PUBLICATIONS

CA99(12):89229w "Accelerated Chemical etching of Kapton polyimide films", Hawkins et al., C. M. (E. I. Du Pont de Nemours (O), Proc. Tech. Program-Annu. Int. Electron. Packag. Conference 2nd 1982, 653-62 (Eng.).

The Condensed Chemical Dictionary, 7th ed. p. 746 "beta-picoline".

*Primary Examiner*—John Kight, III
*Assistant Examiner*—P. Hampton Hightower

[57] ABSTRACT

Disclosed is an aromatic copolyimide film prepared by chemical conversion of a copolyamide acid solution obtained by copolymerization of an aromatic tetracarboxylic acid component comprising from 30 to 50 mole % of biphenyltetracarboxylic acid dianhydride, 50 to 70 mole % of pyromellitic acid dianhydride, 60 to 80 mole % of p-phenylenediamine and 20 to 40 mole % of 4,4'-diaminodiphenyl ether. The aromatic copolyimide film has a low coefficient of thermal expansion, low water absorption, a low coefficient of hygroscopic expansion, high mechanical strength and is readily etchable making it suitable for use an advanced electronic substrate.

17 Claims, No Drawings

COPOLYIMIDE FILM WITH IMPROVED PROPERTIES

BACKGROUND OF THE INVENTION

This invention relates to a copolyimide film having low water absorption, low coefficients of hygroscopic and thermal expansion, enhanced etchability, and increased modulus, particularly useful for use as a tape automated bonding (TAB) substrate.

TAB is an electronic chip packaging technology which uses an etched, fine-line conductor pattern in a flexible carrier tape form.

The common construction of the tape carrier/interconnect product is virtually identical to flexible circuitry, except for two special features. An opening, appropriately called a window, is formed near the center of the conductor array in the dielectric base film. The window permits the etched conductor leads to extend over the opening, creating the essential beam type interconnect array.

The other characteristic of TAB is the precision sprocket holes located on the edge of the tape. TAB tape is provided in reel form, looking much like movie film and is available in widths from 8 to 70 mm.

The integrated circuit (IC) connection to TAB is accomplished by placing the chip in the window area beneath the unsupported connectors, or "fingers", aligning the leads with the metal-coated bonding pads on the chip, and then gang bonding the entire array by thermal compression. A raised metal area, called a "bump", must be incorporated into the IC pads or into the TAB leads to make the bonding process workable. This gang bonding technique, called inner lead bonding (ILB), provides two important features, viz. assembly speed and connection to higher density chips. The bonded IC is usually protected by applying organic potting compound onto the chip for protection in a process called "globbing" or "encapsulation". The loaded tape is then assembled to the printed circuit.

The subsequent TAB-to-circuit bonding step, called outer lead bonding (OLB) requires that the TAB interconnect area be etched from the tape. The etched TAB component is bonded to the surface of the printed circuit by aligning the TAB outer lead frame to corresponding bond sites on the circuit and then applying bonding energy by thermal compression or reflow soldering. The resulting assembly occupies a smaller space, has a very low profile and has superior electrical characteristics compared to its popular wire-bonded counterpart.

Three-layer TAB tapes are the most widely used today. This type of tape consists of copper foil which is often 1.4 mils thick and is bonded to a polyimide film with a layer of polyester, acrylic, or epoxy based adhesive. Normally, the polyimide film is coated on one side with adhesive and slit to the correct width. The windows and sprocket holes are punched or chemically etched out and the tape is then laminated to the copper foil. The foil is then selectively etched into the radiating patterns that form the IC interconnects.

Two-layer TAB tapes are becoming more functionally useful and consist of copper bonded directly to polyimide, without a layer of polyester, acrylic, or epoxy based adhesive. Most often, the copper is applied to the polyimide by sputtering or electroless plating and built to a thick, 1.4 mil layer of copper by electroplating. Sprocket holes can be punched, but windows are etched in the polyimide.

The polyimide used as the base film in TAB tapes must have a relatively small thermal expansion coefficient which is close to the thermal expansion coefficient of the metallic film, otherwise curling of the composite tape occurs during exposure to high temperatures during processing. The film must have good flexibility to avoid cracking on TAB equipment and high modulus so that sprocket holes do not distort during movement of the tape.

The film must also have a low coefficient of hygroscopic expansion so that dimensions stay more constant with humidity changes, thereby making humidity control less important in processing and causing less stress to build up in humidity cycling to prevent cracking. Finally, film etchability allows chemical etching of holes in the dielectric rather than punching them or using laser cutting.

U.S. Pat. No. 4,778,872 issued to Sasaki et al. on Oct. 18, 1988, discloses a copolyimide film derived from biphenyltetracarboxylic acid dianhydride, pyromellitic acid dianhydride and aromatic diamines prepared by a thermal conversion process and having a relatively small thermal expansion coefficient, high mechanical strength and good flexibility. However, this thermally converted copolyimide film has a high coefficient of hygroscopic expansion and is not readily etchable making it unsuitable for use as a base film in a TAB tape.

It has now been found that a copolyimide film derived from biphenyltetracarboxylic acid dianhydride, pyromellitic acid dianhydride, diaminodiphenylether and p-phenylenediamine prepared by a chemical conversion process provides advantages compared to copolyimide film prepared by a thermal conversion process. These advantages include enhanced chemical (caustic) etchability up to 400° C. cure, reduced coefficient of hygroscopic expansion, reduced water absorption, lower thermal coefficient of expansion and higher modulus.

SUMMARY OF THE INVENTION

The present invention relates to an aromatic copolyimide film with a modulus of elasticity of 600 to 1200 Kpsi, a coefficient of thermal expansion of 5 to 25 ppm/°C., a coefficient of hygroscopic expansion of 2 to 30 ppm/% RH, a water absorption of less than 3.0% at 100% RH and an etch rate greater than the same copolyimide film prepared by a thermal conversion process using the same time and temperature conditions. Such film is prepared by a chemical conversion process which comprises the steps of:

(a) reacting substantially equimolar amounts of an aromatic tetracarboxylic acid component selected from the group consisting of biphenyltetracarboxylic acid or a functional derivative thereof and pyromellitic acid or a functional derivative thereof and an aromatic diamine component selected from the group consisting of a p-phenylenediamine and a diaminodiphenyl ether in an inert organic solvent for a sufficient time and at a temperature below 175° C. sufficient to form a copolyamide acid solution in said solvent;

(b) mixing said copolyamide acid solution with a conversion chemical capable of converting the copolyamide acid to copolyimide;

(c) casting or extruding the mixture from step (b) onto a smooth surface to form a copolyamide acid-copolyimide gel film; or alternatively in place of steps (b) and (c) a single step of casting or extruding said copolyamide acid solution into a mixture or solution of conversion chemicals capable of converting the copolyamide acid to a copolyamide acid-copolyimide gel film; and (d) heating said gel film at a temperature and for a time sufficient to convert said copolyamide acid to copolyimide.

More specifically, the chemical conversion process for preparing the copolyimide of the present invention comprises copolymerizing from 10 to 90 mole %, preferably 60 to 80 mole % of p-phenylenediamine, 90 to 10 mole %, preferably 20 to 40 mole %, diaminodiphenylether, 10 to 90 mole %, preferably 30 to 50 mole % biphenyltetracarboxylic acid dianhydride and 90 to 10 mole %, preferably 50 to 70 mole % pyromellitic acid dianhydride.

DETAILED DESCRIPTION OF THE INVENTION

The aromatic copolyamide acid used in the present invention is a high molecular weight copolyamide acid prepared by copolymerizing substantially equimolar amounts of an aromatic tetracarboxylic acid component comprising, based on the total amount of the tetracarboxylic acid component, 10 to 90 mole %, preferably 30 to 50 mole %, of a biphenyltetracarboxylic acid or a functional derivative thereof and 90 to 10 mole %, preferably 50 to 70 mole %, of a pyromellitic acid or a functional derivative thereof and an aromatic diamine component comprising, based on the total amount of the aromatic diamine component, 10 to 90 mole %, preferably 60 to 80 mole %, of p-phenylenediamine, and 90 to 10 mole %, preferably 20 to 40 mole %, of a diaminodiphenyl ether.

If the amount of biphenyltetracarboxylic acid used as the aromatic tetracarboxylic acid component is too low at a given diamine ratio, the resultant copolyimide film has an increased hygroscopic expansion coefficient and increased water absorption. If the amount of biphenyltetracarboxylic acid used is too high at a given diamine ratio, etchability of the copolyimide film will decrease.

In the aromatic diamine component, if the amount of the p-phenylenediamine used is too low at a constant dianhydride ratio, then the resultant copolyimide film has a high thermal expansion coefficient or a low modulus of elasticity, resulting in poor stiffness and heat resistance. If the amount of p-phenylenediamine component is too high at a constant dianhydride ratio, the modulus increases and the resultant copolyimide film loses its flexibility.

Examples of the biphenyltetracarboxylic acid and its functional derivatives used in the present invention include 2,3,3',4'-biphenyltetracarboxylic acid and its dianhydride, 3,3',4,4'-biphenyltetracarboxylic acid and its dianhydride (BPDA), and lower alcohol esters of the acids. Preferred examples of pyromellitic acid and its functional derivatives, include pyromellitic acid and its dianhydride (PMDA), and lower alcohol esters thereof.

Examples of useful diaminodiphenyl ethers include 4,4'-diaminodiphenyl ether (DADE), 3,3'-diaminodiphenyl ether and 3,4'-diaminodiphenyl ether.

The aromatic copolyamide acid is prepared by copolymerizing substantially equimolar amounts of the aforesaid aromatic tetracarboxylic acid and aromatic diamine components at a polymerization temperature not higher than 175° C., preferably not higher than 90° C. for about one minute to several days in an inert organic solvent. The aromatic tetracarboxylic acid and aromatic diamine components can be added either neat, as a mixture or as solutions to the organic solvent or the organic solvent may be added to the components.

The organic solvent may dissolve one or all of the polymerizing components and, preferably, will dissolve the copolyamide acid polymerization product. The solvent must, of course, be substantially unreactive with all of the polymerizing components and with the copolyamide acid polymerization product.

Preferred solvents include normally liquid N,N-dialkylcarboxylamides, generally. Preferred solvents include the lower molecular weight members of such carboxylamides, particularly N,N-dimethylformamide and N,N-dimethylacetamide. Other useful compounds of this class of solvents are N,N-diethylformamide and N,N-diethylacetamide. Other solvents which may be used are dimethylsulfoxide, N-methyl-2-pyrrolidone, N-cyclohexyl-2-pyrrolidone, tetramethyl urea, dimethylsulfone, hexamethylphosphoramide, tetramethylenesulfone, diglyme, pyridine and the like. The solvents can be used alone, in combinations with one another or in combinations with poor solvents such as benzene, benzonitrile, dioxane, etc. The amount of solvent used preferably ranges from 75 to 90 weight % of the copolyamide acid solution, since this concentration has been found to give optimum molecular weight.

It is not required that the aromatic tetracarboxylic acid and aromatic diamine components be used in absolutely equimolar amounts. In order to adjust the molecular weight, the molar ratio of aromatic tetracarboxylic acid component to aromatic diamine component can range from 0.90 to 1.10.

The aromatic copolyamide acid solution prepared as described above contains from 5 to 40 weight %, preferably 10 to 25 weight %, of copolyamide acid polymer.

A critical feature of the invention process is the conversion of the copolyamide acid to copolyimide using a chemical conversion process. According to the chemical conversion process, the copolyamide acid solution is either immersed in or mixed with conversion chemicals. The polyamide acid conversion chemicals are typically tertiary amine catalysts and anhydride dehydrating materials. The preferred anhydride dehydrating material is acetic anhydride and is often used in slight molar excess of the amount of amide acid groups in the copolyamide acid, typically about 2-2.4 moles per equivalent of copolyamide acid. A comparable amount of tertiary amine catalyst is often used.

Besides acetic anhydride, other operable lower fatty acid anhydrides include propionic, butyric, valeric, mixed anhydrides of these with one another and with anhydrides of these with one another and with anhydrides of aromatic monocarboxylic acids, for example, benzoic acid, naphthoic acid, and the like, and with anhydrides or carbonic and formic acids, as well as aliphatic ketenes (ketene and dimethyl ketene). Ketenes may be regarded as anhydrides of carboxylic acids derived from drastic dehydration of the acids.

The preferred tertiary amine catalysts are pyridine and beta-picoline and they are used in varying amounts from zero to several moles per mole of anhydride dehydrating material. Tertiary amines having approximately the same activity as the preferred pyridine and beta-picoline may also be used. These include alpha picoline; 3,4-lutidine; 3,5-lutidine; 4-methyl pyridine; 4-isopropyl pyridine; N,N-dimethylbenzyl amine; isoquinoline; 4- benzyl pyridine, N,N-dimethyldodecyl amine and triethyl amine. Trimethyl amine is more active than those amines listed above and can be used in smaller amounts.

The polyamide acid conversion chemicals react at about room temperature or above to convert copolyamide acid to copolyimide. The chemical conversion reaction preferably occurs at temperatures from 15° to 120° C., with the reaction being very rapid at the higher temperatures and very slow at the lower temperatures.

The chemically treated polyamide acid solution is cast or extruded onto a heated conversion surface whereupon some of the solvent is evaporated from the solution, the copolyamide acid is partially chemically converted to copolyimide, and the solution takes the form of a copolyamide acid-copolyimide gel. Alternately, the polyamide acid solution can be extruded into a bath of conversion chemicals consisting of an anhydride component and a tertiary amine component with or without a diluting solvent. Conversion of amide acid groups to imide groups depends on contact time and temperature but is usually about 25 to 75% complete. The gel is self-supporting in spite of its high solvent content.

The gel may or may not be treated by extraction, coating, or some other means. It is then subsequently dried to remove the water, residual solvent, and remaining conversion chemicals, and the copolyamide acid is completely converted to copolyimide. The drying can be conducted at relatively mild conditions without complete conversion of copolyamide acid to copolyimide at that time, or the drying and conversion can be conducted at the same time using higher temperatures. Because the gel has so much liquid which must be removed during the drying and converting steps, the gel must be restrained during drying to avoid undesired shrinkage. In continuous production, the film can be held at the edges, such as in a tenter frame using tenter clips or pins for restraint.

Preferably, high temperatures are used for short times to dry the film and convert it to copolyimide in the same step. It is preferred to heat the film to a temperature of 200°-550° C. for at least one second. Of course, less heat and time are required for thin films than for thicker films. During this drying and converting, the film is restrained from undue shrinking and, in fact, can be stretched by as much as 200 percent of its initial dimension prior to completion of the drying and conversion. Stretching can be in any dimension. In film manufacture, stretching can be in either the longitudinal direction or the transverse direction. If desired, restraint can also be provided to permit some limited degree of shrinkage.

Caustic etching rate of the chemically converted films, within the compositional scope of this invention is much greater than the corresponding caustic etching rate of thermally converted films. Etch rate was determined by measuring the film thickness and then contacting one surface of the film with a caustic etchant consisting of 2N KOH in 80:20 (by volume) ethanol:water at 30° C. for 40 minutes as described in U.S. Pat. No. 4,426,253. Afterwards the film surface was rinsed with deionized water at a rate of 100 ml./min. for five minutes, and then the film was dried and remeasured for thickness. The loss in film thickness in mils/hour/side was calculated.

Temperature of final cure can also affect etch rates despite the method of conversion used. With chemical conversion, however, it is possible to meet and exceed 400° C. cure without decreasing etch rates as much as would be observed if the films were thermally cured at equivalent temperatures.

The copolyimide film prepared as herein described has a unique combination of properties such as a high modulus of elasticity of about 600 to 1200 Kpsi, a low coefficient of thermal expansion of about 5 to 25 ppm/°C., a low coefficient of hygroscopic expansion of about 2 to 30 ppm/%RH, a water absorption of less than 3.0%, excellent caustic etchability and good adhesion.

It is believed that these properties are enhanced due to the greater crystallinity of the copolyimide film obtained by chemical conversion as compared to thermal conversion. Accordingly, the copolyimide film can be advantageously used as a base film for a flexible printed circuit board and, particularly, for tape automated bonding.

The advantageous properties of this invention can be observed by reference to the following examples which illustrate, but do not limit, the invention. All parts and percentages are by weight unless otherwise indicated. In the discussion above and in the examples RH means relative humidity.

EXAMPLE 1

A mixture of 7.56 g of p-phenylenediamine (PPD), 6.00 g of 4,4'-diaminodiphenyl ether (DADE), 11.76 g of biphenyltetracarboxylic acid dianhydride (BPDA) and 12.21 g of pyromellitic acid dianhydride (PMDA) in 158 ml. dimethylacetamide was copolymerized at a temperature of 23° C. with stirring for 2 hours. A 6% solution of PMDA in DMAC (16 ml.) was added to provide a reaction liquid containing about 19 weight % of aromatic polyamide acid having an inherent viscosity of 1.93 and a rotation viscosity of 5632 poises.

(A) Chemically converted films were made by casting samples of the polyamide acid solution on a Pyrex ® glass plate and immersing in a 1:1 by volume mixture of acetic anhydride and beta-picoline. The gel film was pinned on a frame and heated at from 100° to 300° C. under nitrogen in a vacuum and maintained at 300° C. for 30 minutes.

(B) Thermally converted films were prepared by casting samples of the polyamide acid solution on a Pyrex ® glass plate and drying on a hot plate at 70° C. The film was pinned on a frame and heated at 100° C. to 300° C. under nitrogen in a vacuum and maintained at 300° C. for 30 minutes.

Samples of the chemically converted (A) and thermally converted films (B), approximately 2 to 3 mils thick, were clamped on frames and heated for 5 minutes at 350° C. or 375° C. The film samples were weighed and then etched for 10 minutes at 40° C. in a 2N KOH solution in 80/20 ethanol-water. After rinsing in distilled water for 5 minutes, the etched films were dried and reweighed. The results given in Table I show that chemically converted films etch faster than thermally converted films when cured at temperatures up to 375° C.

Therefore, this example compared the etch rate of a chemically vs. a thermally converted 40 mole % BPDA/60 mole % PMDA; 70 mole % PPD/30 mole % DADE copolyimide film.

TABLE I

Comparative Etch Rate of Chemical vs. Thermal Conversion of 40% BPDE/60% PMDA: 70% PPD/30% DADE

| Temp. °C. | Chemical Conversion | | | Thermal Conversion | | |
|---|---|---|---|---|---|---|
| | Initial Weight (g) | Final Weight (g) | Weight Loss (%) | Initial Weight (g) | Final Weight (g) | Weight Loss (%) |
| 300 | 0.12229 | 0.07871 | 35.6 | 0.09241 | 0.07183 | 22.3 |
| 350 | 0.11376 | 0.07914 | 30.4 | 0.12622 | 0.11564 | 8.4 |
| 375 | 0.14331 | 0.12273 | 14.4 | 0.13523 | 0.12568 | 7.1 |

EXAMPLES 2 TO 6

These examples illustrate the preparation of copolyimide films of the invention having different ranges of monomer components prepared by a chemical conversion process. Comparison to the same copolyimide compositions prepared by a thermal conversion process, show the commercially converted copolyimides of the invention to have a lower water absorption, lower thermal expansion coefficient, higher modulus and a much higher rate of caustic etchability.

Aromatic copolyamide acid solutions in DMAC (15% solids) were prepared in the same manner as described in Example 1, except that the ratios of the monomers used were changed as shown in Table II.

Thermally converted films were prepared by casting samples of the copolyamide acid solutions on a Pyrex ® glass plate and drying the films at 70° C. The films were then pinned on frames and cured for one hour at 300° C. under nitrogen in a vacuum and subsequently heat treated for 5 minutes at 400° C.

Chemically converted films were prepared by casting samples of the copolyamide acid solutions on a Pyrex ® glass plate and then immersing the cast films in a 1:1 by volume mixture of acetic anhydride and beta-picoline until the gelled films floated free from the glass. The gel films were pinned on frames and cured at 300° C. and then for 5 minutes at 400° C.

The etch rates were determined by the method described in U.S. Pat. No. 4,426,253, using an etching solution of 2N KOH in 80:20 by volume ethanol:water and immersing the copolyimide film samples at 30° C. for 40 minutes. Etching was performed in a Lucite cell so that only one side of the film was etched. The etched film samples were subsequently rinsed in distilled water at a rate of 100 ml/minute for 5 minutes.

Water absorptions were determined by placing strips of film in a 100% relative humidity chamber for 48 hours at room temperature. The film samples were subsequently analyzed for water content by thermal gravimetric analysis at 10° C./minute between a temperature range of 35° to 250° C.

Thermal expansion coefficients (CTE) were measured by placing strips of film (6 mm wide × 30 mm long) on quartz hooks in a Mettler thermal mechanical apparatus. A constant force of 0.005 Newton was imposed on the sample and the temperature was raised to 350° C. under nitrogen at a rate of 10° C./minute. The sample was allowed to cool while relaxed and the same heating conditions were applied again. The CTE was measured between 40° and 250° C.

The tensile modulus was measuring using a Standard Instron testing apparatus and the values are the average of three runs.

The results are given in Table II.

TABLE II

Properties of BPDA/PMDA:PPD/DADE Copolyimide Films Prepared by a Chemical Conversion Process vs. a Thermal Conversion Process

| Ex. No. | Monomers (mole %) | | | | Etch* rate (mils/hr/side) | | Water Absorption (%) | | CTE** (ppm/°C.) | | Modulus (Kpsi) | |
|---|---|---|---|---|---|---|---|---|---|---|---|---|
| | BPDA | PMDA | PPD | DADE | Chem | Therm | Chem | Therm | Chem | Therm | Chem | Therm |
| 2 | 40 | 60 | 70 | 30 | 0.92 | 0.06 | 2.26 | 3.01 | 15.0 | 39.0 | 875 | 666 |
| 3 | 30 | 70 | 60 | 40 | 1.26 | 0.50 | 2.44 | 3.28 | 14.0 | 35.0 | 602 | 545 |
| 4 | 30 | 70 | 80 | 20 | 1.45 | 0.28 | 2.84 | 3.50 | 8.0 | 27.0 | 743 | 688 |
| 5 | 50 | 50 | 60 | 40 | 0.54 | 0.03 | 2.27 | 2.60 | 22.0 | 42.0 | 651 | 519 |
| 6 | 50 | 50 | 80 | 20 | 0.66 | 0.15 | 2.28 | 2.59 | 11.0 | 31.0 | 705 | 656 |

*Mils/hour/side at 30° C. for 40 minutes using an etching solution of 2NKOH in 80:20/ethanol:water.
**Coefficient of thermal expansion in ppm/°C.

EXAMPLES 7 TO 10

These examples illustrate the effect of curing temperature and reaction solvent on the coefficient of hygroscopic expansion of a copolyimide of the invention prepared by chemical conversion as compared to the same copolyimide prepared by thermal conversion.

Solutions of a BPDA/PMDA:PPD/DADE (40/60:70/30 mole %) copolyamide acid in both DMAC and N-methylpyrrolidone solvents were prepared as described in Examples 2 to 6.

Thermally converted films were prepared by casting samples of the copolyamide acid solutions onto Pyrex ® glass plates and drying at 70° C. for 20 minutes. The films were subsequently clamped on pin frames and cured at 300° C. for 90 minutes and then at 400° C. for 5 additional minutes.

Chemically converted films were prepared by casting samples of the copolyamide acid solutions on Pyrex ® glass plates and then immersing the plates in a 1:1 by volume mixture of acetic anhydride and beta-picoline until the films loosened from the glass plates. The films were clamped on pin frames and cured at 300° C. for 60 minutes and then at 400° C. for an additional 5 minutes.

Coefficients of hygroscopic expansion were measured and are given in Table III.

The results dramatically show that the chemically converted copolyimide films of the invention have a much lower coefficient of hygroscopic expansion then the corresponding thermally converted copolyimide films making them more suitable for use in applications where dimensional stability to high humidity conditions is required. The use of DMAC instead of NMP also provided lower hygroscopic expansion coefficients in both thermal and chemical conversion processes. In general, higher cure temperatures also resulted in lower coefficients of hygroscopic expansion.

TABLE III

Hygroscopic Expansion Coefficients of a 40 BPDA/60 PMDA: 70 PPD/30 DADE Copolyimide Prepared by a Chemical Conversion Process vs. a Thermal Conversion Process

| Example No. | Conversion Process | Cure Temperature (°C.) | Reaction Solvent | CHE (PPM/% RH) |
|---|---|---|---|---|
| 7 | Chemical | 400 | DMAC | 12.9 |
|   | Thermal  | 400 | DMAC | 24.6 |
| 8 | Chemical | 400 | NMP  | 13.3 |
|   | Thermal  | 400 | NMP  | 28.3 |
| 9 | Chemical | 300 | DMAC | 17.0 |
|   | Thermal  | 300 | DMAC | 26.0 |
| 10 | Chemical | 300 | NMP  | 19.0 |
|   | Thermal  | 300 | NMP  | 30.9 |

What is claimed is:

1. An aromatic copolyimide film with a modulus of elasticity of 600 to 1200 Kpsi, a coefficient of thermal expansion of 5 to 25 ppm/°C., a coefficient of hygroscopic expansion of 2 to 30 ppm/% RH and a water absorption of less than 3.0% at 100% RH prepared employing a chemical conversion process with the steps:

(a) reacting substantially equimolar amounts of an aromatic tetracarboxylic acid component selected from the group consisting of a biphenyltetracarboxylic acid or a functional derivative thereof and a pyromellitic acid or a functional derivative thereof and an aromatic diamine component selected from the group consisting of p-phenylenediamine and a diaminodiphenyl ether in an inert organic solvent for a sufficient time and at a temperature below 175° C. sufficient to form a copolyamide acid solution in said solvent;

(b) mixing said copolyamide acid solution with a conversion chemical capable of converting the copolyamide acid to copolyimide;

(c) casting or extruding the mixture from step (b) onto a smooth surface to form a copolyamide acid-copolyimide gel film; or alternatively in place of steps (b) and (c) a single step of casting or extruding said copolyamide acid solution into a mixture or solution of conversion chemicals capable of converting the copolyamide acid to a copolyamide acid-copolyimide gel film; and (d) heating said gel at a temperature and for a time sufficient to convert said copolyamide acid to copolyimide, wherein the aromatic copolyimide film has an etch rate in a caustic etchant of 2N KOH in 80:20 by volume ethanol:water at 30° C. greater than a comparative film formed by the same components except the comparative film uses a thermal conversion process employing the same time and temperature conditions of said aromatic copolyimide film rather than said chemical conversion process.

2. The film of claim 1 wherein the aromatic tetracarboxylic acid component comprises from 10 to 90 mole % of a biphenyltetracarboxylic acid or a functional derivative thereof and 90 to 10 mole % of a pyromellitic acid or a functional derivative thereof.

3. The film of claim 1 wherein the aromatic diamine component comprises from 10 to 90 mole % of p-phenylenediamine and from 90 to 10 mole % of a diaminodiphenyl ether.

4. The film of claim 2 wherein the aromatic tetracarboxylic acid component comprises from 30 to 50 mole % of a biphenyltetracarboxylic acid or a functional derivative thereof and from 50 to 70 mole % of a pyromellitic acid or a functional derivative thereof.

5. The film of claim 3 wherein the aromatic diamine component comprises from 60 to 80 mole % of p-phenylenediamine and from 20 to 40 mole % of a diaminodiphenyl ether.

6. The film of claim 2 wherein the aromatic tetracarboxylic acid component comprises biphenyltetracarboxylic acid dianhydride and pyromellitic acid dianhydride.

7. The film of claim 3 wherein the aromatic diamine component comprises p-phenylenediamine and 4,4'-diaminodiphenyl ether.

8. The film of claim 4 wherein the aromatic tetracarboxylic acid component comprises biphenyltetracarboxylic acid dianhydride and pyromellitic acid dianhydride.

9. The film of claim 5 wherein the aromatic diamine component comprises p-phenylenediamine and 4,4'-diaminodiphenyl ether.

10. The film of claim 1 wherein the aromatic tetracarboxylic acid component comprises from 30 to 50 mole % of biphenyltetracarboxylic acid dianhydride and from 50 to 70 mole % of pyromellitic acid dianhydride and the aromatic diamine component comprises from 60 to 80 mole of p-phenylenediamine and from 20 to 40 mole % of 4,4'-diaminodiphenyl ether.

11. The film of claim 10 wherein the aromatic tetracarboxylic acid component comprises 40 mole % of biphenyltetracarboxylic acid dianhydride and 60 mole % of pyromellitic acid dianhydride and the aromatic diamine component comprises 70 mole % of p-phenylenediamine and 30 mole % of 4,4'-diaminodiphenyl ether.

12. The film of claim 1 wherein the conversion chemicals comprise tertiary amine catalysts and anhydride dehydrating agents.

13. The film of claim 12 wherein the tertiary amine is beta-picoline and the dehydrating agent is acetic anhydride.

14. The film of claim 1 wherein the temperature for converting the copolyamide acid to copolyimide ranges from 200° to 550° C.

15. The film of claim 1 wherein the inert organic solvent is selected from the group consisting of N-methyl-2-pyrrolidone, dimethylsulfoxide, N,N-dimethylacetamide, N,N-dimethylformamide, N,N-diethylacetamide, N,N-diethylformamide and mixtures thereof.

16. The film of claim 15 wherein steps (b) and (c) are employed.

17. An aromatic copolyimide film with a modulus of elasticity of 600 to 1200 Kpsi, a coefficient of thermal expansion of 5 to 25 ppm/°C., a coefficient of hygroscopic expansion of 2 to 30 ppm/% RH and a water absorption of less than 3.0% at 100% RH prepared employing a chemical conversion process with the steps:

(a) reacting substantially equimolar amounts of an aromatic tetracarboxylic acid component selected from the group consisting of a biphenyltetracarboxylic acid or a functional derivative thereof and a pyromellitic acid or a functional derivative thereof and an aromatic diamine component selected from the group consisting of p-phenylenediamine and a diaminodiphenyl ether in an inert organic solvent for a sufficient time and at a temperature below 175° C. sufficient to form a copolyamide acid solution in said solvent;

(b) casting or extruding said copolyamide acid solution into a mixture or solution of conversion chemicals capable of converting the copolyamide acid to a copolyamide acid-copolyimide gel film; and (c) heating said gel film at a temperature and for a time sufficient to convert said copolyamide acid to copolyimide, wherein the aromatic copolyimide film has an etch rate in a caustic etchant of 2N KOH in 80:20 by volume ethanol:water at 30° C. greater than a comparative film formed by the same components except the comparative film uses a thermal conversion process employing the same time and temperature conditions of said aromatic copolyimide film rather than said chemical conversion process.

* * * * *